(12) United States Patent
Zeller (10) Patent No.: US 12,136,144 B1
(45) Date of Patent: Nov. 5, 2024

(54) COMPUTER-IMPLEMENTED METHOD FOR OPERATING AN IMAGING FACILITY, IMAGING FACILITY, COMPUTER PROGRAM AND ELECTRONICALLY READABLE DATA CARRIER

(71) Applicant: Siemens Healthineers AG, Forchheim (DE)

(72) Inventor: Mario Zeller, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 0 days.

(21) Appl. No.: 18/637,722

(22) Filed: Apr. 17, 2024

(30) Foreign Application Priority Data

Apr. 17, 2023 (DE) .................. 10 2023 203 460.3

(51) Int. Cl.
*G06T 11/00* (2006.01)
*G01R 33/56* (2006.01)

(52) U.S. Cl.
CPC ........ *G06T 11/005* (2013.01); *G01R 33/5608* (2013.01); *G06T 11/006* (2013.01); *G06T 2200/28* (2013.01); *G06T 2210/41* (2013.01); *G06T 2211/441* (2023.08)

(58) Field of Classification Search
CPC ................................................. G06T 11/005
See application file for complete search history.

(56) References Cited

U.S. PATENT DOCUMENTS

2018/0103912 A1* 4/2018 Canfield .................. A61B 8/06
2022/0092771 A1* 3/2022 Itu ......................... G06T 7/0012
2022/0130520 A1* 4/2022 Xia ......................... G16H 30/40
2022/0202384 A1   6/2022 Saiki et al.
2023/0153456 A1* 5/2023 Lee ..................... G06V 10/7715
                                                        726/27

(Continued)

FOREIGN PATENT DOCUMENTS

JP       2018130142 A    8/2018
JP        6423094 B2    11/2018

OTHER PUBLICATIONS

Sabbagh, Majid, et al.: "Cardiac MRI compressed sensing image reconstruction with a graphics processing unit", In: 2016 10th International Symposium on Medical Information and Communication Technology (ISMICT), IEEE, 2016, pp. 1-5.

(Continued)

*Primary Examiner* — Oneal R Mistry
(74) *Attorney, Agent, or Firm* — Banner & Witcoff Ltd.

(57) ABSTRACT

The disclosure relates to techniques for operating an imaging facility for preparing an imaging process. For each imaging process, at least one image dataset is reconstructed in a reconstruction step from raw data recorded in accordance with at least one recording protocol using a reconstruction facility with reconstruction software. For advance calculation of a duration for the reconstruction step, an input dataset comprising at least one protocol parameter of the recording protocol influencing the duration of the reconstruction step and at least one hardware parameter describing the hardware of the reconstruction facility and/or at least one software parameter describing the reconstruction software is compiled, and the duration is ascertained from the input dataset by way of a trained advance calculation function, which is trained by machine learning.

11 Claims, 4 Drawing Sheets

(56) References Cited

U.S. PATENT DOCUMENTS

2023/0154594 A1\* 5/2023 Dutta Choudhury .... A61B 6/03
382/128
2023/0289960 A1\* 9/2023 Takeuchi .............. G06T 7/0012

OTHER PUBLICATIONS

Bielecki, Jan; Smialek, Michal, "Estimation of execution time for computing tasks", Cluster Computing, 2022, pp. 1-14.
Aug. 14, 2023 (DE) Office Action—App. 102023203460.3 (w/English Translation).
Sep. 26, 2023 (DE) Decision to Grant—App. 102023203460.3 (w/English Translation).
Raschka S. et al.: "A Short Chronology of Deep Learning for Tabular Data", (2922) https://sebastianraschka.com/blog/2022/deep-learning-for-tabular-data.html.
Liang D. et al.: "Variational Autoencoders for Collaborative Filtering", Track: User Modeling, Interaction and Experience on the Web, WWW 2018, Apr. 23-27, 2018, Lyon, France, https://dl.acm.org/doi/10.1145/3178876.3186150.
Thomas C. et al.: "Tabular Data Analysis with Deep Neural Nets", Towards Data Science, Sep. 10, 2019 https://sebastianraschka.com/blog/2022/deep-learning-for-tabular-data.html.
Verma S. et al.: "Counterfactual Explanations for Machine Learning: A Review", arXiv:2010.10596v1 [cs.LG] Oct. 20, 2020 https://arxiv.org/pdf/2010.10596.pdf.

\* cited by examiner

COMPUTER-IMPLEMENTED METHOD FOR OPERATING AN IMAGING FACILITY, IMAGING FACILITY, COMPUTER PROGRAM AND ELECTRONICALLY READABLE DATA CARRIER

CROSS-REFERENCE TO RELATED APPLICATIONS

The present application claims priority to and the benefit of Germany patent application no. DE 10 2023 203 460.3, filed on Apr. 17, 2023, the contents of which are incorporated herein by reference in their entirety.

TECHNICAL FIELD

The disclosure relates to a computer-implemented method for operating an imaging facility for preparing an imaging process, wherein for each imaging process, at least one image dataset is reconstructed in a reconstruction step from raw data recorded in accordance with at least one recording protocol using a reconstruction facility with reconstruction software. In addition, the disclosure relates to an imaging facility, a computer program, and to an electronically readable data carrier.

BACKGROUND

Imaging methods in medical engineering are becoming increasingly more refined with the advances in technology. It is possible, in particular, to record ever larger volumes of raw data and a wide variety of raw data using medical imaging facilities. At the same time, however, reconstruction techniques, with which image datasets may be derived from the raw data, are also constantly improving. Reconstruction methods of this kind relate in the case of computed tomography, for example, to the ascertainment of higher dimensional image datasets from low-dimensional projection data, in the case of positron emission tomography (PET), to the ascertainment of PET images from correspondingly established events and in the case of magnetic resonance imaging, to the ascertainment of magnetic resonance image datasets from k-space data. Artificial intelligence, in particular in the form of reconstruction functions trained by machine learning, for example neural networks, are also increasingly being used in reconstructions in order to overcome the complex reconstruction tasks.

SUMMARY

The reduction in the required raw data is often the primary focus in the field of magnetic resonance imaging, which is distinguished by relatively long recording times, since a pronounced shortening of the recording time is also possible hereby. Novel reconstruction methods and imaging methods, such as Simultaneous Multi Slice (SMS), Compressed Senzig (CS), CAIPIRINHA and the like, exist in this regard, with approaches based on deep machine learning (Deep Learning) often also being used.

In general, long extensions to the reconstruction time conversely occur with such shortenings of the recording time. Apart from the hardware provided in the computing facility used, for example the number of CPU cores, the CPU clock frequency and the properties of the CPUs used, a large number of further parameters influence the duration of the reconstruction step in order to obtain the at least one desired image dataset. Firstly, these are protocol parameters of a recording protocol used, which influence the data volume; secondly, internal logics of the reconstruction software may also have an influence. With SMS imaging or CAIPIRINHA, these are, for example, acceleration factors in the phase encoding or slice direction (frequently also the slice selection direction). With "deep learning" methods, the duration of the reconstruction also depends on the network architecture or the network type, which differs, for example, depending on recording protocol, with magnetic resonance imaging, for example, of at least one magnetic resonance sequence, for the imaging and/or type of reference scan.

Recording protocols are conventionally set on imaging facilities by a user, with also the possibility of adjusting individual protocol parameters of the recording protocol. It is also possible for users to create recording protocols. However, in these cases it is not respectively evident how changes to the recording protocol affect the duration of the reconstruction, so trial-and-error methods are frequently applied to discover the settings most suitable for the user. A plurality of recording protocols may also be used in the context of an imaging process, e.g. a medical imaging examination process of a patient. Here, it is also essential with regard to the durations of the reconstruction (reconstruction times) that all image datasets are available as far as possible at the end of the imaging process to enable potentially necessary additional recordings or repetitions without having to summon the patient again. For this reason it is sometimes necessary for the user to alter the order of recording protocols in an imaging process accordingly. An alteration of this kind may also be necessary to enable planning of the slice position of successive recording protocols.

In this connection, it would be conceivable to provide durations of the reconstruction step for respective recording protocols and protocols, which have been set and protocol parameters which have been set with the aid of manually maintained decision trees, although owing to the complex dependencies, which may also change between different software versions, this would be associated with a lot of effort and would also be extremely error-prone.

The disclosure is therefore based on the object of disclosing a possibility for improved planning of imaging processes, e.g. in the medical sector, which makes it possible to take into account reconstruction durations, in particular.

This object is achieved by a computer-implemented method, an imaging facility, a computer program, and an electronically readable data carrier as described herein, including the claims.

With a computer-implemented method of the type mentioned in the introduction, it is provided for advance calculation of a duration for the reconstruction step that:
- an input dataset comprising
  - at least one protocol parameter of the recording protocol influencing the duration of the reconstruction step and
  - at least one hardware parameter describing the hardware of the reconstruction facility and/or at least one software parameter describing the reconstruction software is compiled, and
- the duration is ascertained from the input dataset by way of a trained advance calculation function which is trained by machine learning.

A primary field of application of the present disclosure is medical imaging, application during operation of medical imaging facilities therefore. The medical imaging facility may be, for example, a magnetic resonance facility in which owing to the, in principle, rather longer recording times and the recording techniques, there is particularly frequently the problem of lengthening durations of the reconstruction step, for example also when trained artificial intelligence reconstruction functions are applied, in order to shorten the recording times. The disclosure may also be applied, however, in other and/or combined imaging modalities, for example in computed tomography and positron emission tomography.

In general, a trained function, also specifically the trained advance calculation function therefore, maps cognitive functions, which humans associate with other human brains. By way of training based on training data (machine learning), the trained function is capable of adapting to new circumstances and of detecting and extrapolating patterns.

Generally speaking, parameters of a trained function may be adapted by way of training. For example, supervised learning, semi-supervised learning, unsupervised learning, reinforcement learning and/or active learning may be used. Furthermore, representation learning may also be used (also known as "feature haranguing"). The parameters of the trained function may be adapted, e.g. iteratively, by a plurality of training steps.

A trained function may comprise, for example, a neural network, a Support Vector Machine (SVM), a decision tree, and/or a Bayesian network, and/or the trained function may be based on k-means clustering, Q-learning, genetic algorithms, and/or allocation rules. For example, a neural network may comprise a deep neural network, a Convolutional Neural Network (CNN), or a deep CNN. Furthermore, the neural network may be an Adversarial Network, a deep Adversarial Network, and/or a Generative Adversarial Network (GAN).

It is therefore being proposed to make it possible to predict the duration of the reconstruction step for a recording protocol on the basis of machine learning. In a first step, relevant items of information are summarized in an input dataset. These relevant items of information comprise, e.g. the hardware specifications, the software specifications, and protocol parameters of the set protocol. A trained advance calculation function is then executed with this input dataset, a machine learning model is applied therefore. As output data the trained advance calculation function supplies at least one prediction about the expected duration of the reconstruction. This may then be displayed to a user, for example, in addition to the expected duration of the raw data recording, and this will be discussed in more detail below. The user therefore receives an important item of additional information in the planning phase, which enables the user, for example, to also pay attention to durations for reconstruction steps in the planning of the imaging process, e.g. the examination process of a patient, in such a way that all desired image datasets are reconstructed as soon as possible after the conclusion of the imaging process and may be checked for whether repetitions, additional recordings or the like are necessary. This simplifies operation of the imaging facility, increases the satisfaction of the user, and avoids waiting times, e.g. at the end of the imaging process. It may advantageously be provided that the input dataset is compiled in a specified table format, e.g. as "tabular data" therefore, with which the advance calculation function was or is also trained. It has been identified that data series with the input data, e.g. in a specified sorting, may be written outstandingly, together with a final duration, as individual rows of a table. By way of example, training data for training the advance calculation function may be provided in this way, with the durations of the reconstruction step certainly being known in this connection. The input dataset may be formed by a table for actual imaging processes as well, for example when a plurality of recording protocols is to be applied within the imaging process. Of course it is also possible in this connection, however, to configure the trained advance calculation function such that each recording protocol is then dealt with individually.

Functions based on a decision tree, e.g. random forest functions, are particularly suitable for input data in table format. Many such approaches for "tabular data" are known, with what are known as the "Gradient Boosting Machines" method and the "K-nearest neighbors" method being cited as other examples. The use of Support Vector Machines (SVM) has also been proposed, although these approaches scale poorly and are therefore less preferred.

In recent years it has been found, however, that deep neural nets may also be advantageously used for the regression and classification of input data in table format. Deep neural networks are both reliable and effective for making predictions on the basis of input data in table format. It is therefore also preferred that the trained advance calculation function comprises a deep neural network, e.g. a fully connected deep neural network. For an overview, reference should be made, for example, to a publication by Sebastian Raschka on the Internet, "A Short Chronology of Deep Learning for Tabular Data", published on 24 Jul. 2022 at https://sebastianraschka.com/blog/2022/deep-learning-for-tabular-data.html.

In a specific embodiment it may be provided, for example, that the fully connected deep neural network comprises at least two sequences of a linear matrix multiplication layer and a non-linear layer, e.g. a ReLu layer. This is based on the knowledge that a simple, fully connected deep neural network, which is suitable for almost all analysis tasks of input data in table format, may also be used in the context of the present disclosure. Starting from an input layer, which comprises the input dataset, it is possible to carry out processing by (linear) matrix multiplications and non-linear layers, which may be embodied as ReLu layers or a variant thereof. A batch normalization may be used after the non-linear layer to avoid overfitting. A linear transformation to an output value, here the duration, takes place for the output layer.

As far as the protocol parameters are concerned, these may be limited to those protocol parameters of the recording protocol, which obviously contribute to the volume of raw data or obviously influence the internal information of the reconstruction step or the selection of the reconstruction software. Since the influences are sometimes not fully known, however, the non-variable portions of the recording protocol may also be included. In one example it may be provided that a number of layers is included, but not the orientation of these layers. In magnetic resonance imaging it may be provided that the number of coil channels used is included as a protocol parameter in the input dataset, but not the internal ID of each individual coil channel. It should also be noted at this point that the input dataset or also the trained advance calculation function may of course also include further, in particular fixed, system parameters, which describe, for example, the imaging facility. This is expedient, for example, if the advance calculation function is more generally trained and not solely for a particular imaging facility. A provision of system parameters is optionally also expedient when they become relevant to the reconstruction step as additional items of information. System parameters of this kind may also frequently be used to generate derived items of information, for example derived additional parameters, which may be ascertained from the at least one protocol parameter and the at least one system parameter. In a magnetic resonance facility a system parameter of this kind may be, for example, the field strength of the main magnetic field (BO field).

In a magnetic resonance facility as the imaging facility it may be provided, for example, that at least one, e.g. all, of the at least one protocol parameters of the input data is selected from the group comprising:
- a protocol parameter describing the number of data points in the color coding direction, for example comprising k-space lines added by phase-oversampling,
- a protocol parameter describing the number of data points in the read direction,
- a protocol parameter describing the number of layers,
- a protocol parameter describing the number of coil channels used,
- a protocol parameter describing at least one acceleration factor, and
- at least one protocol parameter describing a reference scan.

The product of the number of data points in the phase encoding direction (usually y, corresponds to the number of k-space lines) and the number of data points in the read direction (usually x) is frequently also referred to as the matrix size. In addition to the avoidance of convolutions, measured K-space lines, which will be deleted again later, may expediently already be included in the number of data points in the phase encoding direction (thus, the number of recorded k-space lines).

An acceleration factor is known from subsampling techniques and may indicate, for example, how many measuring points or k-space lines are omitted and the like. The omitted samplings are then at least partially reconstructed in the reconstruction step.

In a specific embodiment of the disclosure it may also be provided that at least one of the at least one hardware parameters is selected from the group comprising:
- a number of cores of at least one CPU used,
- a clock frequency of the at least one CPU used,
- a model of the at least one CPU,
- a model of at least one GPU used,
- a memory location of the at least one GPU, and
- a memory location of a main memory of the reconstruction facility, and/or that at least one of the at least one software parameters is selected from the group comprising:
- a type and/or an architecture of a used trained reconstruction function,
- a software version of the reconstruction software.

The hardware parameters and software parameters relate therefore to the equipping of the reconstruction facility. The hardware may be described, for example, in that the type, the model therefore, of existing CPUs and GPUs, the number of cores and/or the size of the available memory are indicated. With regard to the software, the type or the category of the network used of a trained reconstruction function or its architecture, the software version and the like may be included.

In a specific exemplary embodiment of a magnetic resonance facility, it may be provided, for example, that all examples cited here for protocol parameters, hardware parameters, and software parameters are included in the input dataset. It has thereby been found that all essential influencing factors are covered.

As already mentioned, it may advantageously be provided that the duration calculated in advance is output to a user, e.g. in a planning interface and/or together with a recording duration for the at least one recording protocol. Imaging facilities conventionally have at least one operator facility with an output facility and an input facility. A planning interface, which is displayed on the output facility, for example a screen, may be used to set and plan in advance the at least one recording protocol for an imaging process. As already explained, the information with regard to the duration of the reconstruction step is extremely useful in this connection. For example, it may be displayed together with the recording duration.

In an advantageous development, it may be provided in this connection that, in addition to the duration, at least one of the plurality of protocol parameters, which has the greatest influence on the duration of the reconstruction step at least with regard to the shortening thereof, starting from the currently selected protocol parameters, is also ascertained in an ascertainment step and output to the user. For instance, a proposal for a new value of the protocol parameter may also be ascertained and output for the at least one ascertained protocol parameter. In general, it may also be said that proposals as to how the duration of the reconstruction step may be reduced may particularly advantageously also be submitted to the user. Suitable protocol parameters may be ascertained for this whose change is most likely to result in a reduction in the duration of the reconstruction step. Particularly advantageously, first of all, still before the ascertainment step therefore, those protocol parameters of the input dataset, which may realistically be changed by the user, may be identified in an identification step. In general, these may be protocol parameters determining the resolution since a reduction in the resolution conventionally results in a reduction in the raw data volume and thus in a reduction in the duration of the reconstruction step. In a magnetic resonance facility as the imaging facility, protocol parameters identified in this way may also be the number of coil channels used and/or a type of reference scan. In an ascertainment step it may then be established for these identified protocol parameters which at least one of these protocol parameters has the greatest influence on the duration of the reconstruction with regard to the shortening thereof. The corresponding information may be output to the user, so the user receives notes on how he may achieve the potentially desired aim. Different variants are conceivable within the context of the disclosure for specific implementation of the ascertainment step.

In the case of magnetic resonance recording protocols, reference scans may serve, for example, for obtaining reference data. By way of example, it is known in many acceleration techniques to fully sample at least the center of the k-space in the reference scan to be able to derive reconstruction parameters herefrom in the reconstruction step.

In an embodiment of the ascertainment step it may be provided that a repeated application of the trained advance calculation function is carried out in the ascertainment step with an input dataset modified in accordance with a modification rule in respect of at least one of the protocol parameters in each case and the at least one protocol parameter, which has the greatest influence on the duration of the reconstruction step, at least with regard to the shortening thereof, starting from the currently selected protocol parameters, is ascertained by comparing the respective results. In this embodiment, the trained advance calculation function may be executed, for example, several times successively, with each of the e.g. identified, protocol parameters being, for example, halved, in each case. On the basis of the predicted durations of the reconstruction step it is then possible to ascertain, for example, the two protocol parameters which have the greatest influence on the duration of the reconstruction step and to display them to the user.

In an alternative embodiment of the ascertainment step it may, however, also be provided that a trained ascertainment function is used in the ascertainment step, which has, for example, a collaborative filtering architecture, comprising, for example, a variational autoencoder, and/or is a counterfactual explanation function. The, identified protocol parameters most relevant to the duration of the reconstruction may be ascertained therefore also by a trained ascertainment function, for example comprising a neural network. For example, a collaborative filtering architecture, such as variational autoencoders, is expedient for this, similar to their use, for example, in recommendation systems in online shops. In this case, similar recording protocols with shorter reconstruction duration may be predicted. By comparing the protocol parameters which change the most percentagewise, e.g. the identified ones, it is then possible to infer the protocol parameters with the greatest influence on the duration of the reconstruction step. Examples of such collaborative filtering architectures are described, for example, in an article by Dawen Liang et al., "Variational Autoencoders for Collaborative Filtering", WWW 2018, 23-27 Apr. 2018, Lyon, France. It is also conceivable to use a method from the field of what is known as counterfactual explanations. Put simply, a target time is specified in this connection and it is then ascertained by way of the trained ascertainment function which, e.g. identified, protocol parameters would have to be changed for the trained advance calculation function to make this prediction. Reference should be made in this connection, for example, to an article by Sahil Verma et al., "Counterfactual Explanations and Algorithmic Recourses for Machine Learning: A Review", arXiv: 2010.10596v3, 15 Nov. 2022.

In a further embodiment in the context of the output of the duration to a user it may be provided that a duration which may be obtained with an upgrade is also calculated in advance and is displayed to the user in the context of an upgrade recommendation for at least one hardware parameter and/or software parameter. The trained advance calculation information may therefore also be implemented again for a reconstruction facility with a more powerful hardware configuration and/or a more powerful software configuration, and with a significant advantage the user may be made aware that when improved reconstruction hardware and/or reconstruction software is acquired, a duration shortened, for example by a particular percentage, may be expected for the reconstruction step.

An embodiment also results when in the case of an imaging process using a plurality of recording protocols, durations are calculated in advance for all individual recording protocols and are output to the user, e.g. in a presentation for selection of the order of the recording protocols. With a recording protocol-specific display of the duration of the reconstruction step, the user may easily identify "bottlenecks" in the chronological sequence and make adjustments, for example by changing the order of the plurality of recording protocols in order to keep waiting times after the conclusion of recording of the raw data as short as possible. Specifically, it may be provided, for example, that apart from the durations calculated in advance, time delays arising due to the reconstruction from previous recording protocols, e.g. accumulated delays, may also be ascertained and displayed. In this way the user particularly advantageously receives an "accumulated delay", which may likewise be useful for planning the imaging process.

In general, it may particularly advantageously be provided that to provide the trained advance calculation function, the function is trained with training datasets ascertained from diagnostic data, which also comprises actual measured reconstruction durations. Since many imaging facilities store the protocol parameters of each recording protocol used as well as the measuring and reconstruction durations in the diagnostic data, a high number of training datasets may be obtained during the development phase as well as from field use, so a robust advance calculation quality may be obtained.

Apart from the method, the disclosure also relates to an imaging facility having a control facility, which is embodied for carrying out the method. All statements in respect of the method may be transferred analogously to the imaging facility, and vice versa, so the advantages already mentioned may also be obtained with the imaging facility.

The imaging facility may e.g. be a magnetic resonance facility, although the disclosure described here may also be applied to other imaging modalities, e.g. in medical imaging. Other imaging modalities of this kind comprise, for example, computed tomography and positron emission tomography, so the imaging facility may also be a computed tomography facility and/or a positron emission tomography facility. Combinations of different imaging modalities on a single imaging facility are also conceivable and may be provided within the context of the present disclosure.

For outputting durations calculated in advance and/or other items of information, for instance, in a planning interface, the imaging facility may comprise an operator facility, which may comprise an output facility and an input facility. For implementation of the method steps the control facility may comprise functional units implemented as hardware and/or software, and/or at least one processor and at least one storage means. For instance, the control facility may comprise a compilation unit for compiling the input dataset and an advance calculation unit for applying the trained advance calculation function. Further conceivable functional units comprise, for example, an output unit, a protocol unit for controlling the imaging process, and an ascertainment unit for ascertaining protocol parameters particularly relevant to a reduction in the duration. The reconstruction facility may also be part of the inventive imaging facility.

A computer program may be loaded directly into a storage means of a control facility of an imaging facility and has program means which, on execution of the computer program on the control facility of the imaging facility, prompt it to carry out the steps of a method. The computer program may be stored on an electronically readable (e.g. non-transitory) data carrier according to the disclosure, which therefore comprises items of control information stored thereon, which comprise at least one computer program and are configured in such a way that when the data carrier is used in a control facility of an imaging facility, they configure the imaging facility to carry out a method.

BRIEF DESCRIPTION OF THE DRAWINGS

Further advantages and details of the present disclosure may be found in the exemplary embodiments described below and with reference to the drawings, in which.

DETAILED DESCRIPTION OF THE DISCLOSURE

Figure 1:
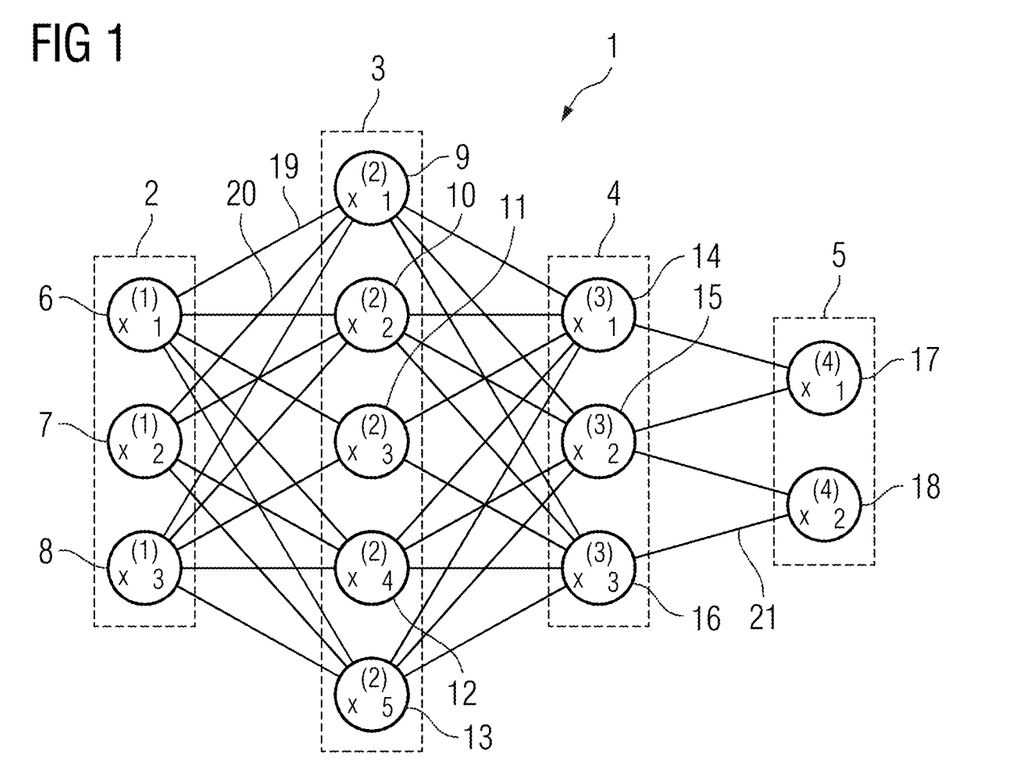
FIG. 1 illustrates an example embodiment of an artificial neural net, in accordance with the disclosure.

FIG. 1 illustrates an example embodiment of an artificial neural net, in accordance with the disclosure. English expressions for the artificial neural net 1 are "artificial neural network", "neural network", "artificial neural net" or "neural net".

The artificial neural network 1 comprises nodes 6 to 18 (nodes) and edges 19 to 21 (edges), with each edge 19 to 21 being a directed connection of a first node 6 to 18 to a second node 6 to 18. In general, the first nodes 6 to 18 and the second nodes 6 to 18 are different nodes 6 to 18, although it is also conceivable that the first nodes 6 to 18 and the second nodes 6 to 18 are identical. By way of example, in FIG. 1 the edge 19 is a directed connection from the node 6 to the node 9 and the edge 21 is a directed connection from the node 16 to the node 18. An edge 19 to 21 from a first node 6 to 18 to a second node 6 to 18 is referred to as the ingoing edge for the second nodes 6 to 18 and as the outgoing edge for the first nodes 6 to 18.

In this exemplary embodiment, the nodes 6 to 18 of the artificial neural net 1 may be arranged in layers 2 to 5 (layers), it being possible for the layers to have an intrinsic order which is introduced between the nodes 6 to 18 by the edges 19 to 21. For instance, edges 19 to 21 may be provided only between adjacent layers of nodes 6 to 18. In the represented exemplary embodiment, an input layer 2, which only has the nodes 6, 7, 8, exists, in each case without ingoing edge. The output layer 5 comprises only the nodes 17, 18, in each case without outgoing edges, with hidden layers 3 and 4 also being located between the input layer 2 and the output layer 5. In the general case, the number of hidden layers 3, 4 may be arbitrarily selected. The number of nodes 6, 7, 8 of the input layer 2 conventionally corresponds to the number of input values in the neural network 1, and the number of nodes 17, 18 in the output layer 5 conventionally corresponds to the number of output values of the neural network 1.

For instance, a (real) number may be assigned to the nodes 6 to 18 of the neural network 1. In this case, $x^{(n)}_i$; denotes the value of the $i^{th}$ node 6 to 18 of the $n^{th}$ layer 2 to 5. The values of the nodes 6, 7, 8 of the input layer 2 are equivalent to the input values of the neural network 1, while the values of the nodes 17, 18 of the output layer 5 are equivalent to the output values of the neural network 1. Furthermore, a weight in the form of a real number may be assigned to each edge 19, 20, 21. For instance, the weight is a real number in the interval [−1, 1] or in the interval [0, 1,]. In this case, $w^{(m,n)}_{i,j}$ denotes the weight of the edge between the $i^{th}$ nodes 6 to 18 of the $m^{th}$ layer 2 to 5 and the $j^{th}$ nodes 6 to 18 of the $n^{th}$ layer 2 to 5. Further, the abbreviation $w^{(n)}_{i,j}$ is defined for the weight $w^{(n,n+1)}_{i,j}$.

To calculate output values of the neural net 1, the input values are propagated by the neural network 1. For instance, the values of the nodes 6 to 18 of the $(n+1)^{th}$ layer 2 to 5 may be calculated on the basis of the values of the nodes 6 to 18 of the $n^{th}$ layer 2 to 5 by evaluating:

$$x_j^{(n+1)} = f(\Sigma_i x_i^{(n)} \cdot w_{i,j}^{(n)})$$

In this case, f is a transfer function, which may also be referred to as an activation function. Known transfer functions are step functions, sigmoid functions (for example the logistical function, the generalized logistical function, the hyperbolic tangent, the arctangent, the error function, the smooth step function), or rectifier functions (rectifier). The transfer function is substantially used for standardization purposes.

In an embodiment, the values are propagated layer-wise by the neural network 1, with values of the input layer 2 being given by the input data of the neural net 1. Values of the first hidden layer 3 may be calculated on the basis of the values of the input layer 2 of the neural net 1, values of the second hidden layer 4 may be calculated on the basis of the values in the first hidden layer 3, etc.

To be able to define the values $w_{i,j}^{(n)}$ for the edges 19 to 21, the neural network 1 is first trained using training data. For instance, training data comprises training input data and training output data, which will be referred to as ti below. For a training step, the neural network 1 is applied to the training input data to ascertain calculated output data. In an embodiment, the training output data and the calculated output data comprise a number of values, with the number being determined as the number of nodes 17, 18 of the output layer 5.

In an embodiment, a comparison between the calculated output data and the training output data is used to recursively adjust the weights within the neural net 1 (back propagation algorithm). For instance, the weights may be changed according to:

$$w_{i,j}'^{(n)} = w_{i,j}^{(n)} - \gamma \cdot \delta_j^{(n)} \cdot x_i^{(n)}$$

where γ is a learning rate and the numbers $\delta_j^{(n)}$ may be recursively calculated as:

$$\delta_j^{(n)} = (\Sigma_k \delta_k^{(n+1)} \cdot w_{j,k}^{(n+1)}) \cdot f'(\Sigma_i x_i^{(n)} \cdot w_{i,j}^{(n)})$$

on the basis of $\delta_j^{(n+1)}$, when the $(n+1)^{th}$ layer is not the output layer 5, and $$\delta_j^{(n)} = (x_k^{(n+1)} - t_j^{(n+1)}) \cdot f'(\Sigma_i x_i^{(n)} \cdot w_{i,j}^{(n)}),$$

if the $(n+1)^{th}$ layer is the output layer 5, with f being the first derivation of the activation function and $y_j^{(n+1)}$ the comparison training value for the $j^{th}$ nodes 17, 18 of the output layer 5.

An example of a convolutional neural network (CNN) will also be given below with regard to FIG. 2. It should be noted in this connection that the expression "layer" is used there in a different way than for conventional neural nets. For a conventional neural network, the expression "layer" refers only to the set of nodes which forms a layer, a particular generation of nodes therefore. For a convolutional neural network, the expression "layer" is often used as an object which actively changes data, in other words, as a set of nodes of the same generation and either the set of ingoing or outgoing edges.

Figure 2:
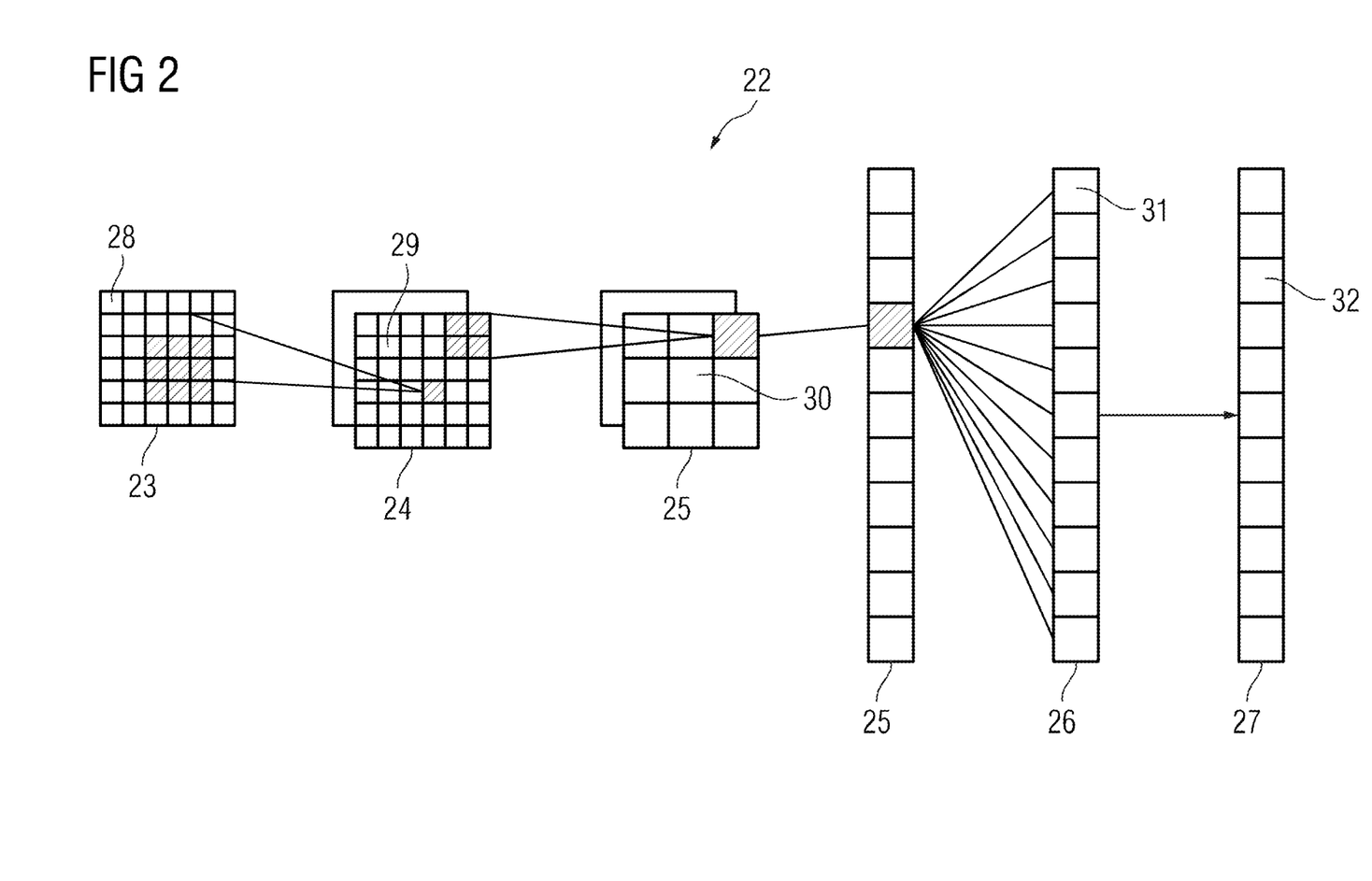
FIG. 2 illustrates an example embodiment of a convolutional neural network, in accordance with the disclosure.

FIG. 2 illustrates an example embodiment of a convolutional neural network, in accordance with the disclosure. FIG. 2 shows an exemplary embodiment of a convolutional neural network 22. In the represented exemplary embodiment, the convolutional neural network 22 comprises an input layer 23, a convolutional layer 24, a pooling layer 25, a fully connected layer 26, and an output layer 27. In alternative embodiments, the convolutional neural network 22 may include a plurality of convolutional layers 24, a plurality of pooling layers 25 and a plurality of fully connected layers 26, just like other types of layers. The order of the layers may be arbitrarily selected, with fully connected layers 26 conventionally forming the last layers before the output layer 27.

In an embodiment, the nodes 28 to 32 of one of the layers 23 to 27 within a convolutional neural network 22 may be understood as being arranged in a d-dimensional matrix or as a d-dimensional image. For instance, in the two-dimensional case, the value of a node 28 to 32 may be denoted by the indices i, j in the $n^{th}$ layer 23 to 27 as $x^{(n)}[i,j]$. Reference is made to the fact that the arrangement of the nodes 28 to 31 of a layer 23 to 27 does not have any effect on the calculations within the convolutional neural network 22 as such since these effects are given solely by the structure and the weights of the edges.

A convolutional layer 24 is distinguished, for instance, in that the structure and the weights of the ingoing edges forms a convolutional operation on the basis of a particular number of cores. For example, the structure and the weights of the ingoing edges may be selected such that the values $x_k^{(n)}$ of the nodes 29 of the convolutional layer 24 are ascertained as a convolution $x_k^{(n)} = K_k * x^{(n-1)}$ on the basis of the values $x^{(n-1)}$ of the nodes 28 of the preceding layer 23, it being possible to define the convolution * in the two-dimensional case as:

$$x_k^{(n)}[i,j] = (K_k * x^{(n-1)})[i,j] = \Sigma_{i'} \Sigma_{j'} K_k[i',j'] \cdot x^{(n-1)}[i-i',j-j'].$$

Here, the $k^{th}$ core $K_k$ is a d-dimensional matrix, in this exemplary embodiment a two-dimensional matrix, which is conventionally small compared to the number of nodes 28 to 32, for example a 3×3 matrix or a 5×5 matrix. For example, this implies that the weights of the ingoing edges are not independent but are selected such that they generate the above convolutional equation. Only nine independent weights exist in the example for a core, which forms a 3×3 matrix (with each entry of the core matrix corresponding to an independent weight), regardless of the number of nodes 28 to 32 in the corresponding layer 23 to 27. For instance, for a convolutional layer 24 the number of nodes 29 in the convolutional layer 24 is equivalent to the number of nodes 28 in the preceding layer 23 multiplied by the number of convolutional cores.

If the nodes 28 of the preceding layer 23 are arranged as a d-dimensional matrix, use of the plurality of cores may be understood as an addition of a further dimension, which is also referred to as a depth dimension, so the nodes 29 of the convolutional layer 24 are arranged as a (d+1)-dimensional matrix. If the nodes 28 of the preceding layer 23 are already arranged as a (d+1)-dimensional matrix with a depth dimension, use of a plurality of convolutional cores may be understood as an expansion along the depth dimension, so the nodes 29 of the convolutional layer 24 are similarly arranged as a (d+1)-dimensional matrix, with the size of the (d+1)-dimensional matrix in the depth dimension being greater by the factor formed by the number of cores than in the preceding layer 23.

The advantage of using convolutional layers 24 is that the spatially local correlation of the input data may be utilized in that a local connection pattern is created between nodes of adjacent layers, for example in that each node has connections to only a small region of the nodes of the preceding layer.

In the represented exemplary embodiment, the input layer 23 comprises thirty six nodes 28 which are arranged as a two-dimensional 6×6 matrix. The convolutional layer 24 comprises seventy two nodes 29, which are arranged as two two-dimensional 6×6 matrices, with each of the two matrices being the result of a convolution of the values of the input layer 23 with a convolutional core. Similarly, the nodes 29 of the convolutional layer 24 may be understood as being arranged in a three-dimensional 6×6×2 matrix, with the last-mentioned dimension being the depth dimension.

A pooling layer 25 is distinguished in that the structure and the weights of the ingoing edges and the activation function of their nodes 30 define a pooling operation on the basis of a non-linear pooling function f. By way of example, in the two-dimensional case the values $x^{(n)}$ of the nodes 30 of the pooling layer 25 may be calculated on the basis of the values $x^{(n+1)}$ of the nodes 29 of the preceding layer 24 as:

$$x^{(n)}[i,j] = f(x^{(n-1)}[id_1, jd_2], \ldots x^{(n-1)}[id_1 + d_1 - 1, jd_2 + d_2 - 1])$$

In other words, the number of nodes 29, 30 may be reduced by the use of a pooling layer 25 in that a number of $d_1 \times d_2$ adjacent nodes 29 in the preceding layer 24 are replaced by a single node 30, which is calculated as a function of the values of said number of adjacent nodes 29. For example, the pooling function f may be a maximum function, an averaging function, or the L2 standard. In an embodiment, the weights of the ingoing edges may be defined for a pooling layer 25 and not be modified by training.

The advantage of the use of a pooling layer 25 is that the number of nodes 29, 30 and the number of parameters is reduced. This results in a reduction in the necessary calculation volume within the convolutional neural network 22 and thus in control of the overfitting.

In the represented exemplary embodiment, the pooling layer 25 is a max-pooling layer in which four adjacent nodes are replaced with just a single node whose value is formed by the maximum of the values of the four adjacent nodes. The max-pooling is applied to each d-dimensional matrix of the previous layer; in this exemplary embodiment, the max-pooling is applied to each of the two two-dimensional matrices, so the number of nodes reduces from seventy two to eighteen.

A fully connected layer 26 is distinguished in that a plurality of, e.g. all, edges between the nodes 30 of the previous layer 25 and the nodes 31 of the fully connected layer 26 are present, it being possible to individually adjust the weight of each of the edges. In this exemplary embodiment, the nodes 30 of the preceding layer 25 and of the fully connected layer 26 are shown as two-dimensional matrices and as non-continuous nodes (represented as a row of nodes, with the number of nodes having been reduced for better representation). In this exemplary embodiment, the number of nodes 31 in the fully connected layer 26 is equal to the number of nodes 30 in the preceding layer 25. In alternative embodiments, the number of nodes 30, 31 may be different.

Furthermore, in this exemplary embodiment, the values of the nodes 32 of the output layer 27 are determined in that the SoftMax function is applied to the values of the nodes 31 of the preceding layer 26. By applying the SoftMax function the total of the values of all nodes 32 of the output layer 27 is one and all values of all nodes 32 of the output layer are real numbers between 0 and 1. If the convolutional neural network 22 is used for the categorization of input data, e.g. the values of the output layer 27 may be interpreted as a probability of the input data falling into one of the different categories.

A convolutional neural network 22 may likewise have a ReLU layer, with ReLU being an acronym for "rectified linear units". In an embodiment, the number of nodes and the structure of the nodes within a ReLU layer is equivalent to the number of nodes and the structures of the nodes of the preceding layer. The value of each node in the ReLU layer may be calculated, for example, by applying a rectifier function to the value of the corresponding node of the preceding layer. Examples of rectifier functions are $f(x)=\max(0,x)$, the hyperbolic tangent, or the sigmoid function.

Convolutional neural networks 22 may be trained, for example, on the basis of a back propagation algorithm. To avoid overfitting, methods of the regularization may be used, for example dropout of individual nodes 28 to 32, stochastic pooling, use of artificial data, weight decay on the basis of the L1 or of the L2 standard or maximum standard limitations.

Figure 3:
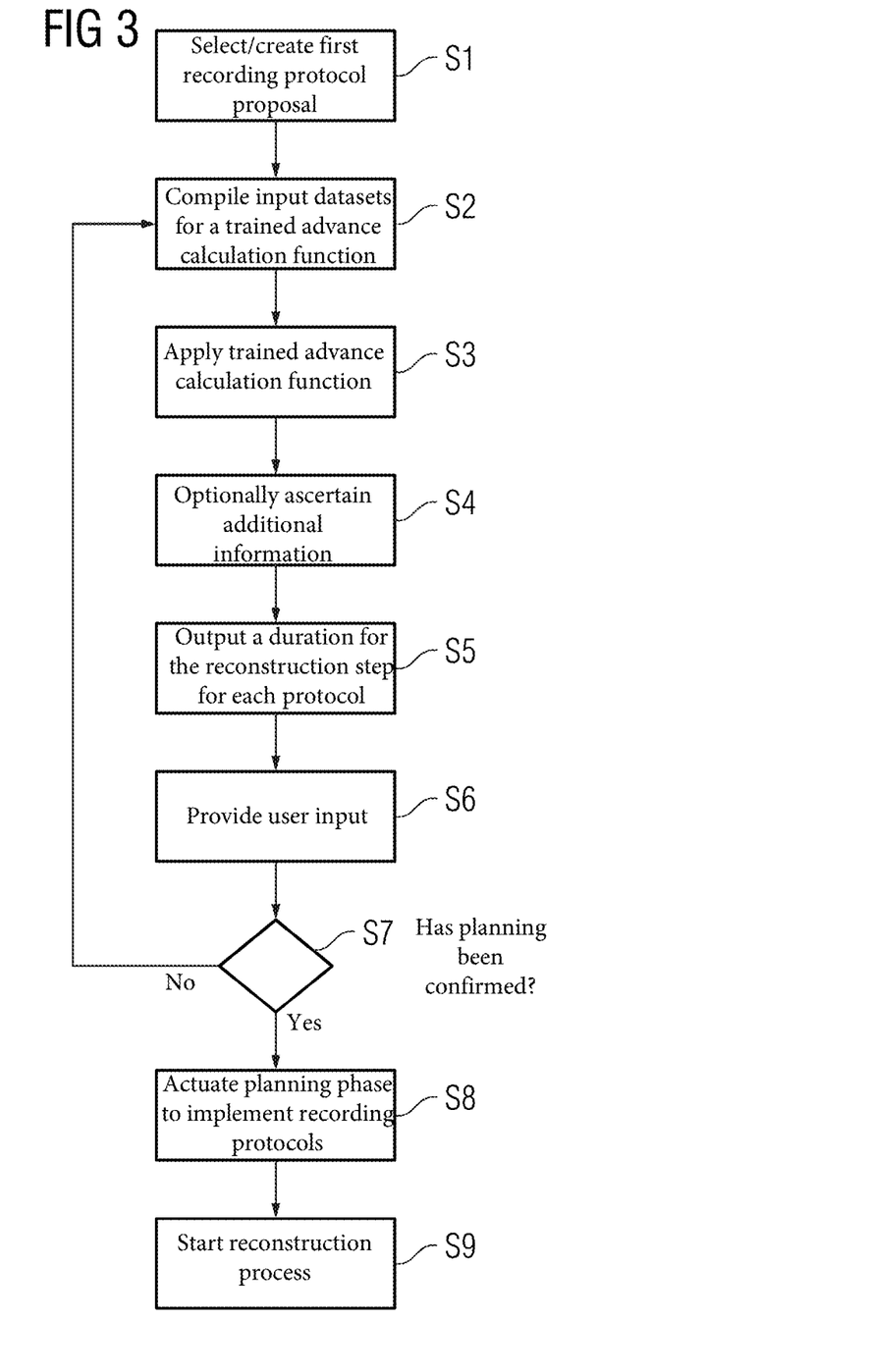
FIG. 3 illustrates a flowchart of an example embodiment of a method, in accordance with the disclosure.

FIG. 3 illustrates a flowchart of an example embodiment of a method, in accordance with the disclosure. FIG. 3 shows a flowchart of an exemplary embodiment of the method. The planning phase of an imaging process on a medical magnetic resonance facility as the imaging facility is considered here by way of example, the planning of an examination process of a patient therefore. The imaging facility may also, potentially additionally, be a computed tomography facility and/or a positron emission tomography facility, however. The imaging facility comprises an operator facility on which the imaging process may be planned and prepared by a user in a planning interface. An imaging process comprises the step of raw data acquisition in accordance with at least one selected and/or adjusted recording protocol and a reconstruction step in which image datasets are reconstructed from the raw data. It is precisely in the application of acceleration techniques in magnetic resonance imaging that the duration for the reconstruction step frequently increases with the reduction in the duration for recording the raw data, with it being desirable, on the other hand, to also have the image datasets immediately available as far as possible after the conclusion of recording of the raw data to be able to check them for necessary repetitions or additional recordings.

In a step S1, a first proposal is selected or created for the at least one recording protocol, with both an automatic proposal and a user-side selection or creation being conceivable. In the present case, as frequently provided in magnetic resonance imaging, a plurality of recording protocols is compiled for the imaging process.

In a step S2, a control facility of the magnetic resonance facility then compiles input datasets for a trained advance calculation function for each recording program, which function calculates the duration of the reconstruction step in advance. The input dataset is structured in a specified table format, compiled as what is known as "tabular data" therefore. The advance calculation function has also been trained in advance with training datasets in this table format in order to be able to provide the trained advance calculation function. Training data sets have been compiled from diagnostic data, which also comprise actually measured reconstruction durations as the "basic truth". Diagnostic data of this kind, which also contains all items of information necessary for the input datasets, are frequently already ascertained and stored in accordance with the prior art anyway. It should be pointed out in this connection that continual improvement of the trained advance calculation function may also take place since ultimately durations of the corresponding reconstruction steps are measured with each definitively confirmed and used recording protocol and thus the performance of the trained advance calculation function may be assessed immediately.

The input dataset comprises two basic categories of input data, namely protocol parameters based on the respective recording protocol and which influence the duration of the reconstruction step on the one hand, and, on the other hand, reconstruction facility parameters based on the reconstruction facility, which may also be regarded as categorical variables. In the present case, the protocol parameters of the input dataset may comprise, for example, a matrix size (the number of K-space lines to be recorded in the phase encoding direction and the number of data points in the read direction for each K-space line therefore), the number of layers, the number of coil channels used, protocol parameters describing at least one reference scan, and at least one acceleration factor, with the number of samplings in the phase encoding direction also comprising k-space lines added by phase-oversampling (oversampling against convolutions). The reconstruction facility parameters are distributed in two groups, namely hardware parameters describing the hardware of the reconstruction facility on the one hand and, on the other hand, software parameters describing reconstruction software used. The hardware parameters may comprise a number of cores of at least one CPU used, a clock frequency of the at least one CPU used, a model of the at least one CPU used, a model of at least one GPU used, a memory location of the at least one GPU used and a memory location of a main memory of the reconstruction facility. The software parameters may comprise a type and/or an architecture of a trained reconstruction function used and a software version of the reconstruction software. Use may be made, for instance, of the fact that most types or architectures of trained functions are already provided with particular names in scientific articles too, and these may be referenced here.

Figure 4:
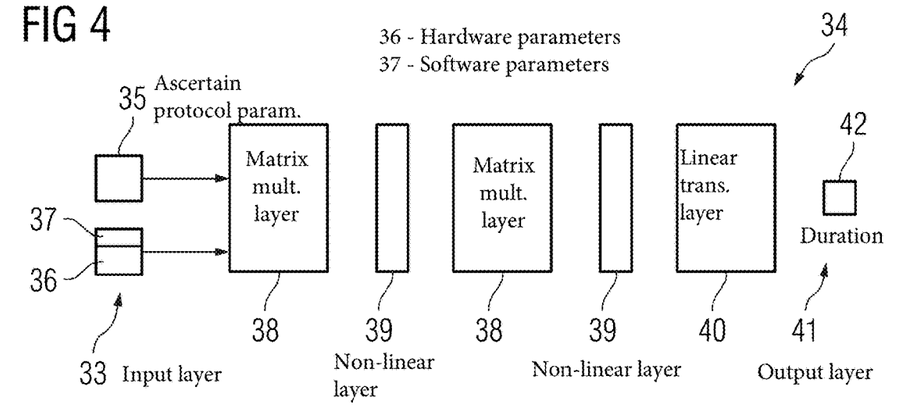
FIG. 4 illustrates an example architecture of a trained advance calculation function, in accordance with the disclosure.

In a step S3, the trained advance calculation function is then applied to the ascertained input dataset, and, more precisely, for each recording protocol. Owing to the use of data in table format it is basically conceivable here, to use, for example, architectures based on at least one decision tree, such as frequently used random forests, with the trained advance calculation function in the present case comprising a deep neural network and having a structure as is represented by way of example in FIG. 4. The input layer 33 of the deep neural network 34 includes the input dataset, as described, comprising the protocol parameters 35 and the reconstruction parameters, which comprise the hardware parameters 36 and the software parameters 37. A matrix multiplication layer 38, a linear operation therefore, and a non-linear layer 39, here a ReLu layer, respectively then follow twice. Batch normalization may be used after the non-linear layer 39 in order to avoid what is known as "overfitting". A linear transformation layer 40, which may in turn comprise a matrix multiplication, results in the output layer 41 in which the duration 42 calculated in advance for the reconstruction step is output.

Returning to FIG. 3, items of additional information are also ascertained in a step S4 which is optional. Items of additional information of this kind may relate to at least one of the plurality of protocol parameters 35, which has the greatest influence on the duration 40 of the reconstruction step at least with regard to the shortening thereof, starting from the currently selected protocol parameters 35. For this, in an identification substep firstly the protocol parameters 35 are identified which may realistically be changed by the user, for example the resolution, the number of coil channels and protocol parameters 35 relating to the type of reference scan. In a subsequent ascertainment step as a substep of step S4, said protocol parameters 35 having the greatest relevance for the shortening of the duration 42 are ascertained from the identified protocol parameters 35. For this, the trained advance calculation function may be repeatedly applied in the ascertainment step with an input dataset modified in accordance with a modification rule in respect of at least one of the identified protocol parameters 35 in each case. The modification rule may comprise, for example, halving the value of the respective identified protocol parameter 35. The at least one protocol parameter 35, which has the greatest influence on the duration of the reconstruction step at least with regard to the shortening thereof, starting from the currently selected protocol parameters 35, may then be ascertained by comparing the respective results.

It is preferred, however, if a trained ascertainment function is used in the ascertainment step, which may comprise a variational autoencoder and/or may be a counterfactual explanation function.

In step S4, it is also optionally possible to check whether significant advantages may be expected with regard to the duration of the reconstruction step with an improvement in the hardware and/or software, an upgrade therefore. If such a clear advantage is expected, the user may also be shown in the subsequent step S5 how greatly the reconstruction duration reduces with the corresponding upgrade.

Finally, delays accumulating owing to the order may also already be calculated in step S4 in the reconstruction for the individual recording protocols.

In a step S5, the duration for the reconstruction step, as was ascertained in step S3, is output for each recording protocol by means of an output facility of the operator facility, for example a screen, with, additionally, the currently selected order of the recording protocols also being displayed together with the resulting accumulated delays owing to reconstructions of preceding recording protocols that are still ongoing. Furthermore, when ascertaining protocol parameters 35 particularly relevant to the shortening of the duration of the reconstruction step, a corresponding recommendation assigned to the respective recording protocols is output, which may also comprise proposed new values for the ascertained protocol parameters 35, moreover.

On the basis of the output information, in a step S6 the user may make inputs by means of an input facility of the operator facility, for example change the order of recording protocols, adjust protocol parameters 35 or else confirm the current configuration. It is expedient in this connection to also output the respective recording durations for the recording protocols with the durations 42.

In a step S7, it is then checked whether confirmation has occurred, planning is complete therefore, or whether changes were made. If changes were made to the protocol parameters 35, the process returns to step S2. It should be pointed out in this connection that accumulated delays which occur in the case of a pure change in the order may of course be immediately displayed "online" by a return to the corresponding part of step S4 and repetition of step S5. It should be pointed out in this connection that in step S5, apart from the durations 42 calculated in advance for the reconstruction step, the recording durations for recording the raw data may also be output to the user, so he may identify, for example, "idle times" and may thus select the order of the recording protocols such that there is a minimal delay at the end of the imaging process.

Once the planning phase is complete, the components of the imaging facility are actuated in a step S8 by the control facility in order to implement the recording protocols of the imaging process. As soon as sufficient raw data is available, the reconstruction processes of the reconstruction step begin in a step S9, e.g. simultaneously, in the reconstruction facility.

Figure 5:
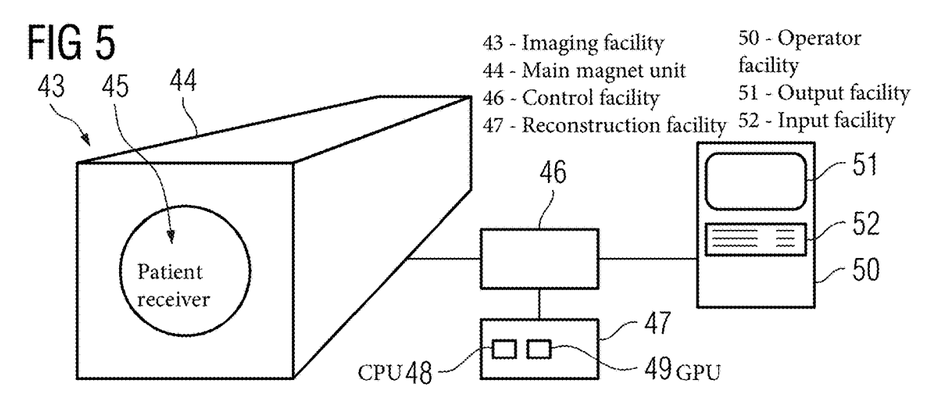
FIG. 5 illustrates a schematic diagram of an example imaging facility, in accordance with the disclosure.

FIG. 5 illustrates a schematic diagram of an example imaging facility, in accordance with the disclosure. FIG. 5 shows a schematic diagram of an inventive imaging facility 43, which in the present case is embodied as a magnetic resonance facility. The magnetic resonance facility, as is basically known, has a main magnetic unit 44, which comprises a main magnet for generating a main magnetic field and defines a cylindrical patient receiver 45 into which a patient may be drawn by means of a patient couch (not shown here). As is basically known, a gradient coil arrangement and/or radio frequency coil arrangement may be provided so as to surround the patient receiver 45; further, local coil arrangements may form part of the magnetic resonance facility. Operation of the imaging facility 43 is controlled by a control facility 46, which is also embodied for carrying out the inventive method. In the present case, the reconstruction facility 47 connected to the control facility 46 uses at least one CPU 48 and at least one GPU 49 for carrying out reconstruction steps and has a main memory (not shown). Likewise connected to the control facility 46 is an operator facility 50 with an output facility 51, here a screen, and an input facility 52.

Figure 6:
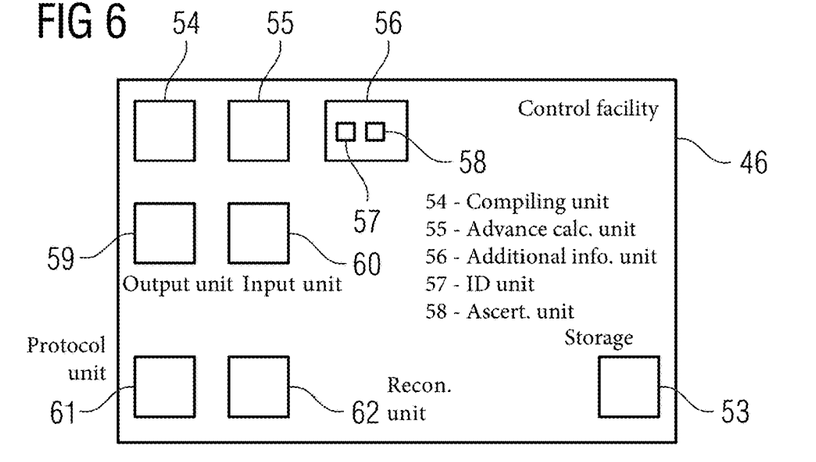
FIG. 6 illustrates the functional structure of an example control facility of the imaging facility, in accordance with the disclosure.

FIG. 6 illustrates the functional structure of an example control facility of the imaging facility, in accordance with the disclosure. FIG. 6 shows the functional structure of the control facility 46 in more detail, which firstly a storage means 53 for storing different items of information, e.g. also of planning parameters, comprising the protocol parameters 35, set in the planning phase of an imaging process. The hardware parameters 36 and the software parameters 37 may also be stored in the storage means 53, just like further useful system parameters, potentially necessary for conversions, which may describe, for example, the field strength of the main magnetic field.

For carrying out the method, the control facility 46 comprises a compiling unit 54 for carrying out step S2 and an advance calculation unit 55 for carrying out step S3. An additional information unit 56 for carrying out step S4 may have, for example, an identification unit 57 and an ascertainment unit 58 as subunits. The output and the user interaction may be controlled in steps S1, S5 and S6 by means of an output unit 59, which may also be used in in a different way, and an input unit 60, which may also be used in a different way.

A generally known protocol unit 61 controls the implementation of imaging processes in accordance with the at least one recording protocol, cf. step S8, while a reconstruction unit 62 controls operation of the reconstruction facility 47, which may also be implemented, moreover, as part of the control facility 46, for carrying out the reconstruction step (step S9).

Although the disclosure has been illustrated and described in detail by the preferred exemplary embodiment, it is not limited by the disclosed examples and a person skilled in the art may derive other variations herefrom without departing from the scope of the disclosure.

Independent of the grammatical term usage, individuals with male, female or other gender identities are included within the term.

The various components described herein may be referred to as "units" or "subunits." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units or subunits, as applicable and relevant, may alternatively be referred to herein as "circuitry," "controllers," "processors," or "processing circuitry," or alternatively as noted herein.

What is claimed is:

1. A computer-implemented method for operating an imaging facility for preparing an imaging process, wherein for each imaging process, at least one image dataset is reconstructed in a reconstruction step from raw data recorded in accordance with at least one recording protocol using a reconstruction facility with reconstruction software, and wherein for advance calculation of a duration of the reconstruction step:
  compiling an input dataset, comprising:
    from among a plurality of protocol parameters, at least one protocol parameter of the at least one recording protocol influencing the duration of the reconstruction step; and
    at least one hardware parameter describing the hardware of the reconstruction facility and/or at least one software parameter describing the reconstruction software;
  ascertaining the duration of the reconstruction step from the input dataset by way of a trained advance calculation function, which is trained by machine learning; and
  outputting the duration of the reconstruction step calculated in advance to a user,
  ascertaining, in addition to the duration of the reconstruction step, a further one of the plurality of protocol parameters, which has a greatest influence on the duration of the reconstruction step at least with regard to a shortening thereof, starting from currently selected protocol parameters; and
  outputting the further one of the plurality of protocol parameters to the user,
  wherein in the ascertaining the duration of the step and the further one of the plurality of protocol parameters comprises a repeated application of the trained advance calculation function that is carried out with the input dataset modified in accordance with a modification rule with respect to at least one of the plurality of protocol parameters in each case and the further one of the plurality of protocol parameter, which has the greatest the influence on the duration, of the reconstruction step at least with regard to the shortening thereof, starting from the currently selected protocol parameters, and comparing the respective results.

2. The method as claimed in claim 1, wherein the input dataset is compiled in a specified table format, with which the advance calculation function was or is also trained.

3. The method as claimed in claim 2, wherein that the trained advance calculation function comprises a function based on a decision tree comprising a random forest function and/or a deep neural network comprising a fully connected deep neural network.

4. The method as claimed in claim 3, wherein the fully connected deep neural network comprises at least two sequences of a linear matrix multiplication layer and a non-linear layer comprising a ReLu layer.

5. The method as claimed in claim 1, wherein when the imaging facility comprises a magnetic resonance facility, the at least one protocol parameters of the input data comprises at least one of:
  a protocol parameter describing a number of data points in a phase encoding direction, in particular comprising k-space lines added by phase-oversampling,
  a protocol parameter describing the number of data points in a read direction,
  a protocol parameter describing a number of layers,
  a protocol parameter; describing a number of coil channels,
  protocol parameters describing at least one reference scan, or
  a protocol parameter describing at least one acceleration factor.

6. The method as claimed in claim 1, wherein the at least one of the at least one hardware parameters comprises at least one of:
  a number of cores of at least one central processing unit (CPU) used,
  a clock frequency of the at least one CPU used,
  a model of the at least one CPU used,
  a model of at least one graphics processing unit (GPU) used,
  a memory location of the at least one GPU used, or
  a memory location of a main memory of the reconstruction facility;
  and/or
  wherein the at least one of the at least one software parameters comprises at least one of:
    a type and/or an architecture of a used trained reconstruction function, or
    a software version of the reconstruction software.

7. The method as claimed in claim 1, wherein the ascertaining the duration of the reconstruction step comprises using a trained ascertainment function, which comprises a collaborative filtering architecture and/or is a counterfactual explanation function.

8. The method as claimed in claim 1, wherein for at least one hardware parameter and/or software parameter, a duration which can be obtained with an upgrade is also calculated in advance and displayed to the user in a context of an upgrade recommendation.

9. The method as claimed in claim 1, wherein for an imaging process using a plurality of recording protocols, durations of the reconstruction step are calculated in advance for each of the plurality of recording protocols and output to the user in a representation for selection of an order of the plurality of recording protocols.

10. An imaging facility, comprising:
  a control facility configured to operate an imaging facility for preparing an imaging process, wherein for each imaging process, at least one image dataset is reconstructed in a reconstruction step from raw data recorded in accordance with at least one recording protocol using a reconstruction facility with reconstruction software, and wherein for advance calculation of a duration of the reconstruction step:
    compiling an input dataset, comprising:
      from among a plurality of protocol parameters, at least one protocol parameter of the at least one recording protocol influencing the duration of the reconstruction step; and at least one hardware parameter describing the hardware of the reconstruction facility and/or at least one software parameter describing the reconstruction software;

ascertaining the duration of the reconstruction step from the input dataset by way of a trained advance calculation function, which is trained by machine learning; and outputting the duration of the reconstruction step calculated in advance to a user, ascertaining, in addition to the duration of the reconstruction step, a further one of the plurality of protocol parameters, which has a greatest influence on the duration of the reconstruction step at least with regard to a shortening thereof, starting from currently selected protocol parameters; and outputting the further one of the plurality of protocol parameters to the user, wherein in the ascertaining the duration of the reconstruction step and the further one of the plurality of protocol parameters comprises a repeated plication of the trained advance calculation function that is carried out with the input dataset modified in accordance with a modification rule with respect to at least one of the plurality of protocol parameters in each case and the further one of the plurality of protocol parameter, which has the greatest the influence on the duration of the reconstruction step at least with regard to the shortening thereof, starting from the currently selected protocol parameters, and comparing respective results.

11. A non-transitory computer-readable medium on which a computer program is stored, execution of the computer program resulting in operating an imaging facility for preparing an imaging process, wherein for each imaging process, at least one image dataset is reconstructed in a reconstruction step from raw data recorded in accordance with at least one recording protocol using a reconstruction facility with reconstruction software, and wherein for advance calculation of a duration of the reconstruction step:

compiling an input dataset, comprising:

from among a plurality of protocol parameters, at one protocol parameter of the at least one recording protocol influencing the duration of the reconstruction step; and at least one hardware parameter describing the hardware of the reconstruction facility and/or at least one software parameter describing the reconstruction software;

ascertaining the duration of the reconstruction step from the input dataset by way of a trained advance calculation function, which is trained by machine learning; and outputting the duration of the reconstruction step calculated in advance to a user, ascertaining, in addition to the duration of the reconstruction step, a further one of the plurality of protocol parameters, which has a greatest influence on the duration of the reconstruction step at least with regard to a shortening thereof, starting from currently selected protocol parameters; and outputting the further one of the plurality of protocol parameters to the user, wherein in the ascertaining the duration of the reconstruction step and the further one of the plurality of protocol parameters comprises a repeated application of the trained advance calculation function that is carried out with the input dataset modified in accordance with a modification rule with respect to at least one of the plurality of protocol parameters in each case and the further one of the plurality of protocol parameter, which has the greatest the influence on the duration of the reconstruction step at least with regard to the shortening thereof, starting from the currently selected protocol parameters, and comparing respective results.

* * * * *